United States Patent [19]

Aslam

[11] Patent Number: 5,474,808
[45] Date of Patent: Dec. 12, 1995

[54] METHOD OF SEEDING DIAMOND

[75] Inventor: Mohammad Aslam, Okemos, Mich.

[73] Assignee: Michigan State University, East Lansing, Mich.

[21] Appl. No.: 178,783

[22] Filed: Jan. 7, 1994

[51] Int. Cl.$^6$ .............................. C23C 16/26; B05D 1/18
[52] U.S. Cl. .................. 427/249; 427/577; 427/282; 427/435; 427/430.1; 427/427
[58] Field of Search .................................. 427/249, 577, 427/282, 435, 430.1, 427

[56] References Cited

U.S. PATENT DOCUMENTS

| | | |
|---|---|---|
| 3,433,684 | 3/1969 | Zanowick et al. |
| 4,808,009 | 2/1989 | Sittler et al. |
| 4,826,784 | 5/1989 | Salerno et al. |
| 4,863,529 | 9/1989 | Imai et al. |
| 4,919,974 | 4/1990 | McCune et al. |
| 4,925,701 | 5/1990 | Jansen et al. |
| 5,006,203 | 4/1991 | Purdes. |
| 5,066,938 | 11/1991 | Kobashi et al. |
| 5,075,094 | 12/1991 | Morrish et al. |
| 5,082,359 | 1/1992 | Kirkpatrick. |
| 5,082,522 | 1/1992 | Purdes et al. |
| 5,087,434 | 2/1992 | Frenklach et al. ................ 427/575 |
| 5,107,317 | 4/1992 | Takasaki. |
| 5,114,696 | 5/1992 | Purdes. |
| 5,131,963 | 7/1992 | Ravi. |
| 5,144,380 | 9/1992 | Kimoto et al. |
| 5,173,761 | 12/1992 | Dreifus et al. |
| 5,183,530 | 2/1993 | Yamazaki. |
| 5,186,973 | 2/1993 | Garg et al. |
| 5,190,823 | 3/1993 | Anthony et al. |
| 5,204,210 | 4/1993 | Jansen et al. ..................... 427/249 |
| 5,242,711 | 9/1993 | DeNatale et al. ................. 156/653 |
| 5,260,141 | 11/1993 | Tsai et al. |
| 5,271,971 | 12/1993 | Herb et al. |
| 5,290,592 | 3/1994 | Izuchi et al. |
| 5,298,286 | 3/1994 | Yang et al. |
| 5,308,661 | 5/1994 | Feng et al. |
| 5,334,342 | 8/1994 | Harker et al. ..................... 427/249 |

OTHER PUBLICATIONS

Masood, A. et al. Techniques for Patterning of CVD Diamond Films on Non–Diamond Substrates; J. Electrochem Soc vol. 138 No. 11 Nov. 1991 pp. unknown.

A. Masood et al. "Synthesis and electrical characterization of boron–doped thin diamond films", Oct. 12, 1992, Appl. Phys. Letter, vol. 61 (15), pp. 1832–1834.

M. Aslam and A. Masood et al. "Thin Film Diamond Temperature Sensor Array for Harsh Aerospace Environment", Apr. 20, 1992, Conference of SPIE in Orlando, Florida, SPIE Code No. 1694–20, no page no. is available.

R. Erz et al. "Preparation of Smooth and Nanocrystalline Diamond Films", Diamond & Related Materials (2)1993 pp. 449–453.

Diamond Depositions; Science and Technology Nov. 22, 1991, vol. 2, No. 8, pp. 1–24.

Primary Examiner—Roy V. King
Attorney, Agent, or Firm—Price, Heneveld, Cooper, DeWitt & Litton

[57] ABSTRACT

Methods for seeding and growing diamond films on planar and non-planar surfaced substrates and also for patterning the diamond films include mixing submicron diameter diamond particles and binder particles in carriers such as photoresist or water, and applying the mixture to a substrate surface. Treatment of the substrate by chemical vapor deposition then removes the carrier and grows the dispersed diamond particles into a diamond film. Notably, diamond particles having an average size of 25 nanometers form a particularly desirable mixture since the particles do not tend to settle out of the mixture, and also since these particles result in smooth diamond films. The mixtures can be applied onto non-planar surfaces by spraying, dipping, or dispensing and jet writing, and can be applied to planar and non-planar surfaces as a complete coating, as a line, or as a pattern. Patterning of the mixture, either when applying the mixture to a substrate or after applying the mixture, allows the formation of novel structures.

33 Claims, 6 Drawing Sheets

DIAMOND PARTICLE
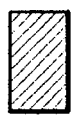DIAMOND
SUBSTRATE
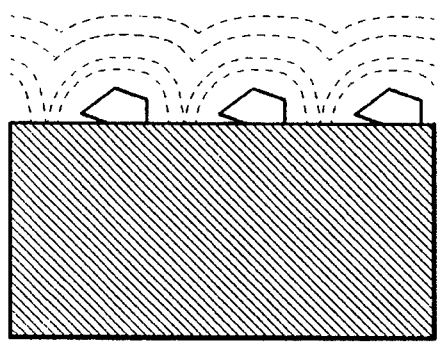
FIG. 3
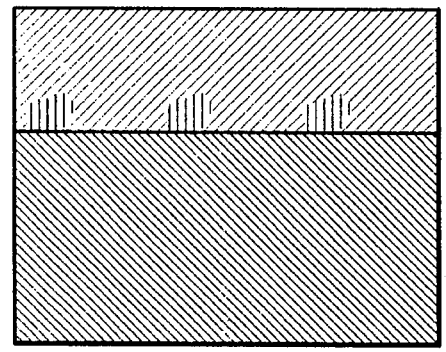
FIG. 4
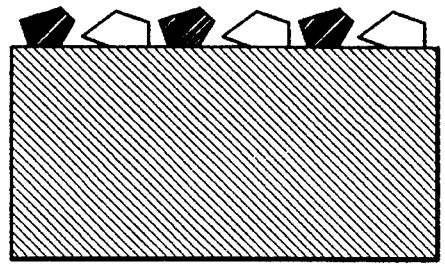
FIG. 5
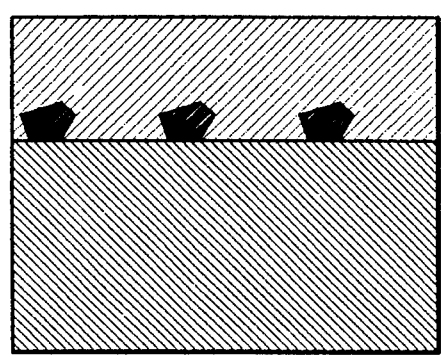
FIG. 6
DIAMOND PARTICLE
BINDER MATERIAL PARTICLE
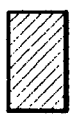DIAMOND
SUBSTRATE

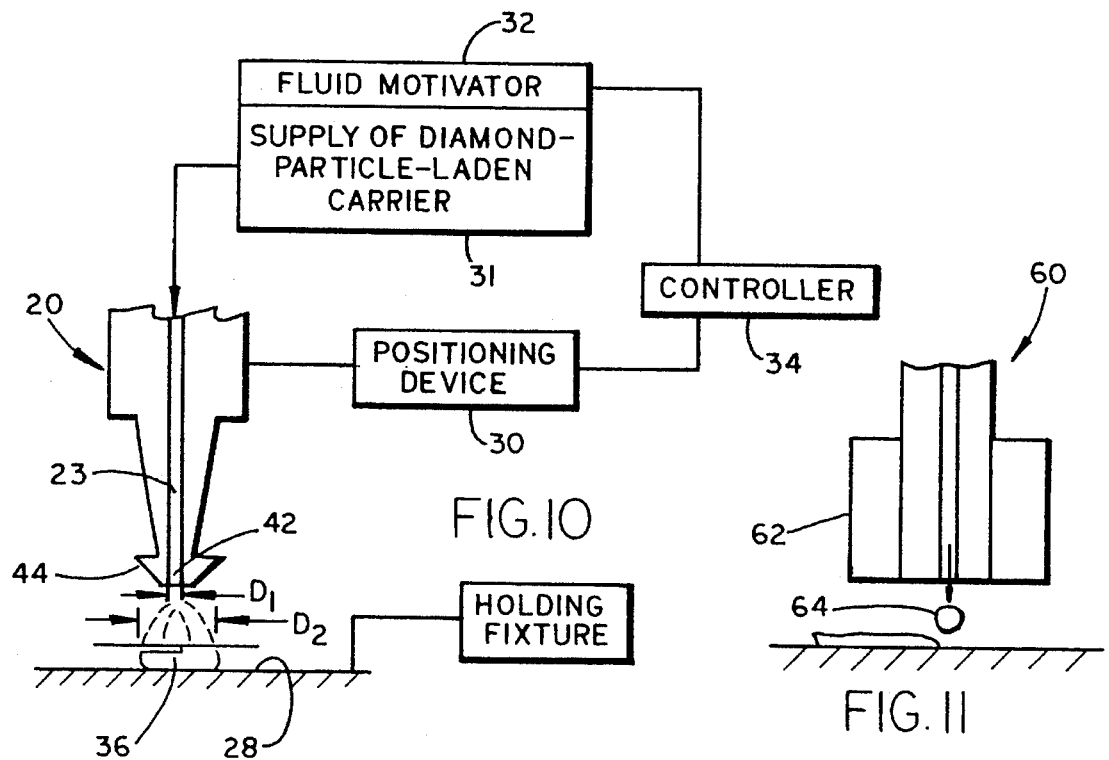
FIG. 10
FIG. 11
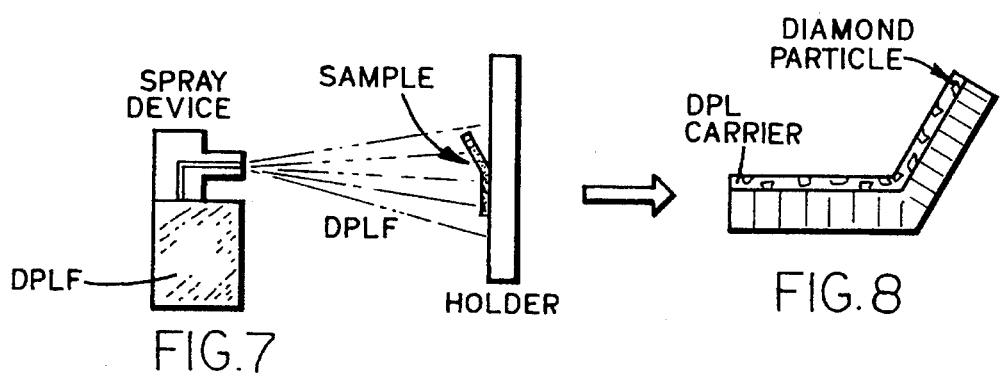
FIG. 7
FIG. 8
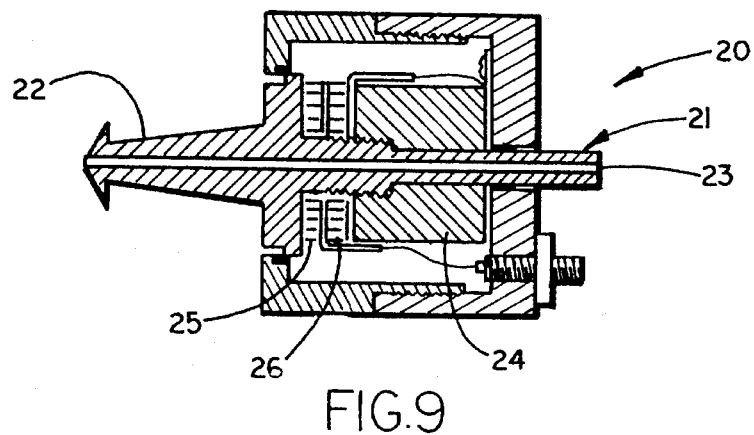
FIG. 9

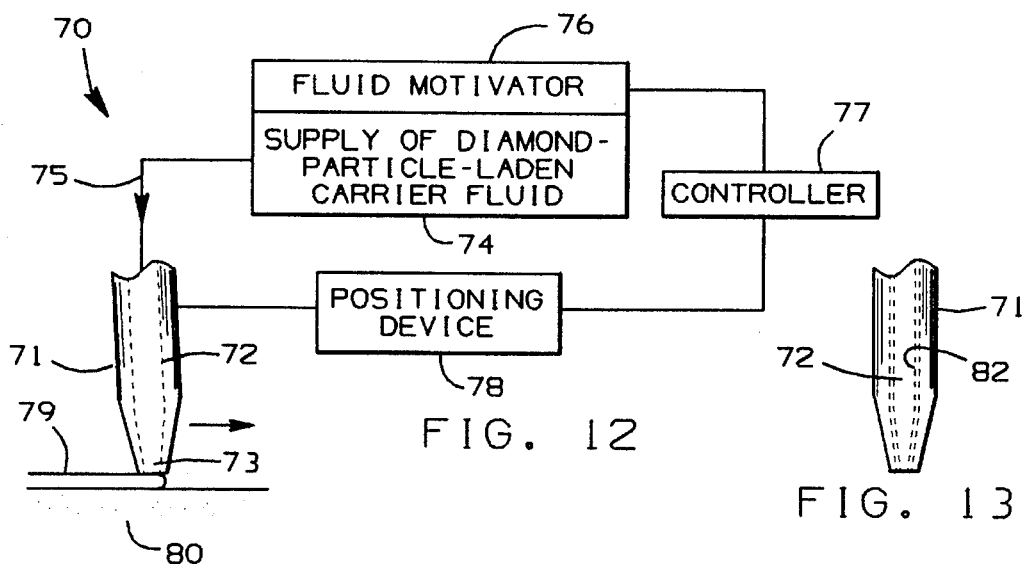
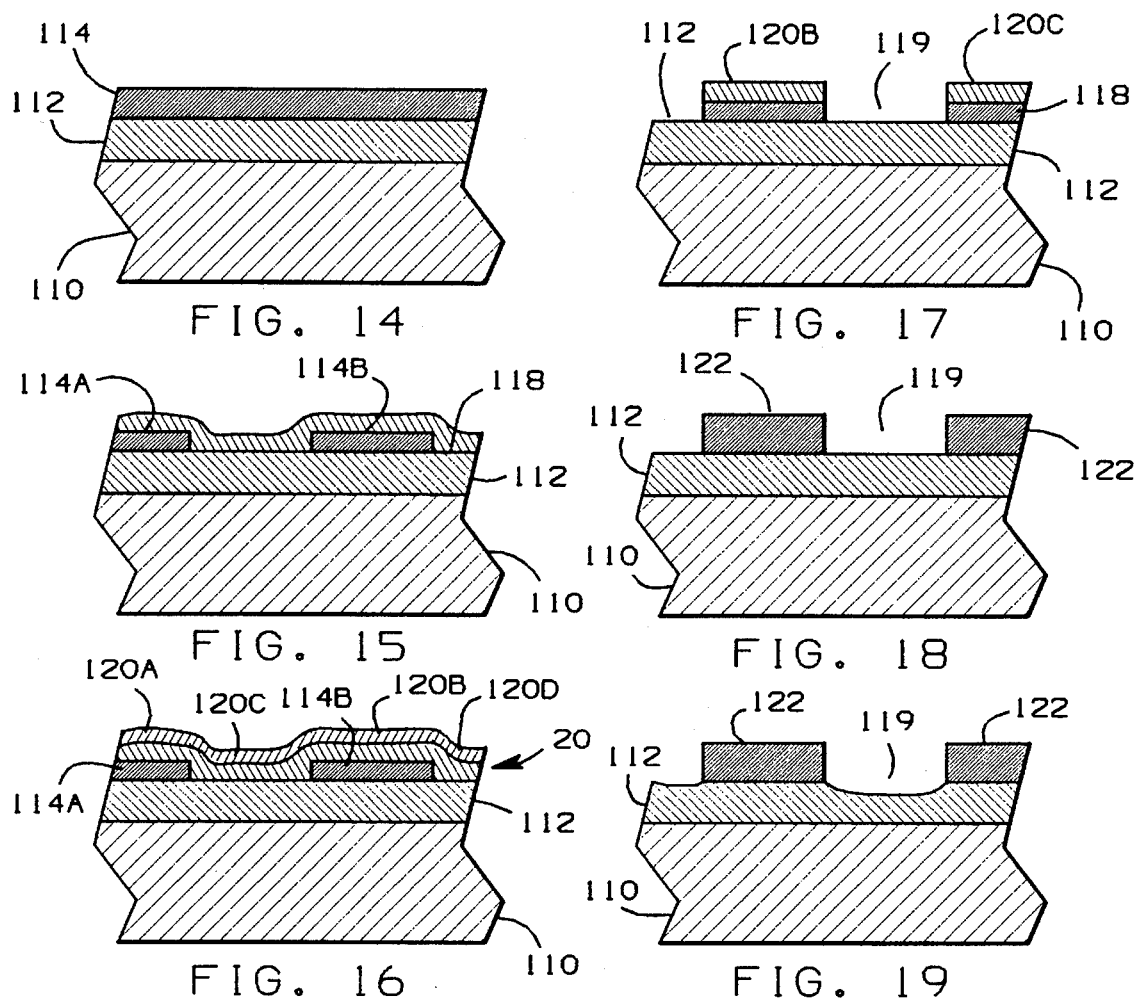

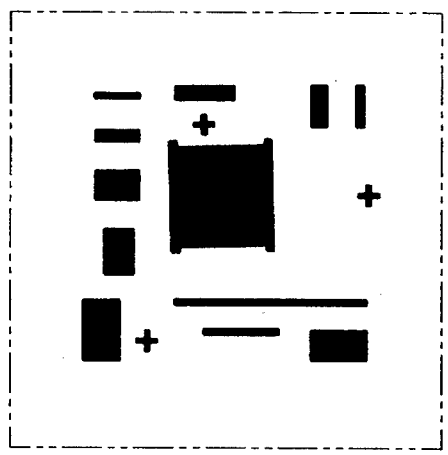
FIG. 24
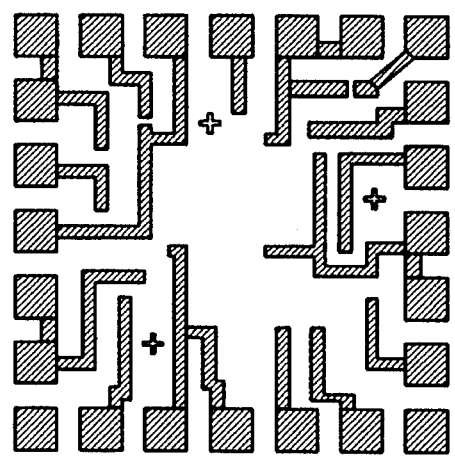
FIG. 25
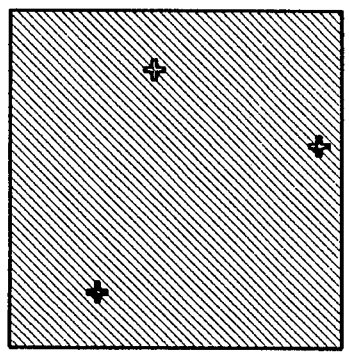
FIG. 26
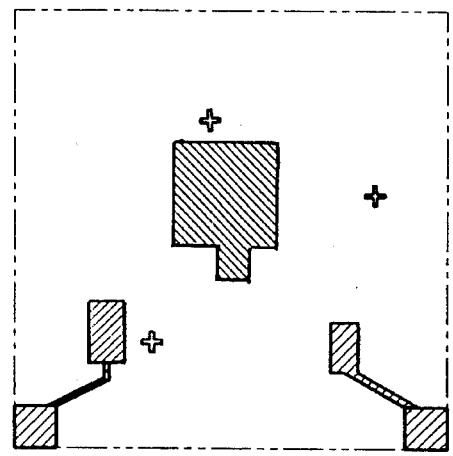
FIG. 27
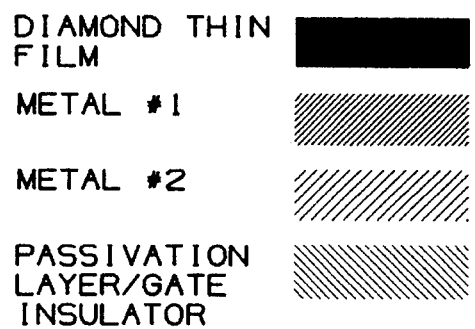
DIAMOND THIN FILM
METAL #1
METAL #2
PASSIVATION LAYER/GATE INSULATOR
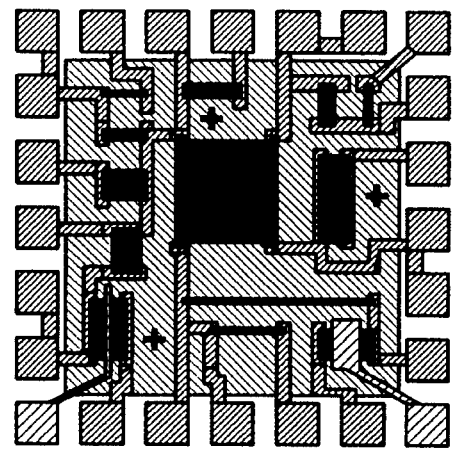
FIG. 28

METHOD OF SEEDING DIAMOND

BACKGROUND OF THE INVENTION

The present invention generally concerns seeding techniques for growing diamond films, and articles and apparatus related thereto. More particularly, the present invention concerns methods for applying diamond particles to surfaces in ways facilitating growth of diamond films and/or diamond film patterns on planar and non-planar non-diamond surfaces, and articles and apparatus related to same.

Diamond films are particularly useful for wear resistant coatings since diamond is one of the hardest materials known to mankind. Advantageously, diamond also has a very high thermal conductivity, a large band gap, and excellent chemical/radiation resistance, thus also making the diamond films useful in high temperature and/or chemically and radiation active environments. Still further, pure diamond films are normally electrically insulative, but can be made electrically conductive by doping, thus making them useful in the electronic industry. For example, one particular application area is diamond film microsensors for sensing strain and temperature. With the advent of recent advances in chemical vapor deposition (CVD) processes, diamond films can now be grown on non-diamond substrates using $CH_4$ and $H_2$ in a timely and cost effective manner.

More particularly, one process of growing a diamond film includes dispensing diamond particles on the surface to be covered (i.e. "seeding") followed by a chemical vapor deposition (CVD) process utilizing $CH_4$ and $H_2$ in which the diamond particles are grown into a layer of crystalline diamond film. The CVD process is well known in the art and is explained, for example, in U.S. Pat. No. 4,925,701. However, the CVD process is very sensitive to the uniformity of the distribution of diamond particles. A non-uniform distribution of diamond particles results in undesirable diamond film characteristics such as thick and fifth areas, film roughness, and discontinuities and breaks in the film.

In U.S. Pat. No. 4,925,701, diamond particles are mixed with an aliphatic alcohol including isopropanol by use of a microsonic disrupter/agitator for achieving maximum uniformity of the suspension. The resulting suspension is applied to a surface by spin, spray or dip coating. However, as noted in a later U.S. Pat. No. 5,204,210, subsequent treatment or pretreatment by a photoresist or a comparable material/process is required in order to create diamond film patterns. Further, the process of patterning requires extra steps and additional manufacturing processing.

Recently, a mixture was made by adding diamond particles of about 0.1 microns average size to photoresist. The mixture was then applied to a flat surface of a substrate by spin coating to uniformly and evenly spread the diamond particles over the flat surface. This process had the advantage of reducing the number of steps required to seed a flat surface since the particles are applied simultaneously with the photoresist. However, the spin coating process is limited to a flat surface and cannot be selectively applied in a pattern without subsequent photolithographic steps. Further, the spin coating process requires the mechanical step of spinning the substrate. Also, the diamond particles of 0.1 microns tend to agglomerate and/or settle out of the photoresist mixture, thus requiring that the mixture be applied soon after mixing. Further, because of the relatively large size of the diamond particles, the 0.1 micron diamond particle mixture results in low nucleation densities and rough film surfaces. Still further, the CVD process grown diamond film exhibits poor adhesion strength when applied to non-diamond substrates, which undesirably limits the lifetime of the diamond film in many applications.

Thus, further advances are desired in terms of simplifying the manufacturing process such as by reducing the number of steps necessary to manufacture diamond film patterns. Also, advances in the application processes for seeding are desired so that non-planar surfaces can be more easily seeded for growing diamond films. Further, improvements are desired in methods and processes to make the processes less sensitive to agglomeration and to settling of diamond particles in a carrier. Further, it is desirable to improve the overall reliability and quality control of the seeding process. For CVD applications in microsensors and other electronic devices, smoother film surfaces are desirable. Also, improvements in the applicators and methods for applying diamond-particle-laden carriers are desired. Still further, improvements in the adhesion of the diamond films to substrates are desired. Concurrently, improvements in application apparatus, processes, materials, and synergistic combinations of same are desired.

SUMMARY OF THE INVENTION

A method of the present invention includes providing a non-diamond substrate having a non-planar surface, and a mixture including a selectively removable carrier and diamond particles suspended in the selectively removable carrier. The method further includes applying the mixture to the non-planar surface of the substrate, and then forming a diamond film on the non-planar surface by a chemical vapor deposition (CVD) process which removes the carrier and grows the diamond film from the diamond particles. In a preferred embodiment, binder particles are added to the carrier to provide increased adhesion of the diamond film to the non-diamond substrate. Notably, the carrier can be selectively applied in lines or patterns on a planar or non-planar surface, such as by use of novel applicators.

These and other features, advantages and objects of the present invention will be further understood and appreciated by those skilled in the art by reference to the following specification, claims and appended drawings.

BRIEF DESCRIPTION OF THE DRAWINGS

FIG. 3 is a schematic view illustrating nanometer sized diamond particles left on the substrate after evaporation of the carrier at the beginning of the chemical vapor deposition (CVD) process, the dashed lines indicating the growth of the diamond film by the CVD process;

FIG. 4 is a schematic view illustrating the diamond film grown from the diamond particles after the CVD process;

FIG. 5 is a schematic view illustrating the growth of nanometer sized diamond particles comparable to FIG. 3 but with the addition of binder particles such as Ti powder;

FIG. 6 is a schematic view showing the diamond film grown from the diamond particles after the CVD process, FIG. 6 being comparable to FIG. 4 but with the addition of the binder particles;

FIG. 7 is a schematic view illustrating application of a diamond-particle-laden (DPL) carrier by an ultrasonic nozzle spray device onto a non-planar surfaced three dimensional substrate;

FIG. 8 is an enlarged schematic view illustrating the three dimensional substrate shown in FIG. 7 after application of the DPL carrier but before treatment by the CVD process;

FIG. 9 is a cross-sectional view of an exemplary ultrasonic nozzle spray device;

FIG. 10 is a schematic view illustrating an exemplary ultrasonic spray device being used for spray writing a line or pattern;

FIG. 11 is a schematic view illustrating an exemplary ink jet device for jet writing a line or pattern;

FIG. 12 is a schematic view illustrating a dispenser/applicator for dispensing or writing a fine line or pattern;

FIG. 13 is a side view of a modified dispenser/applicator comparable to the dispenser/applicator in FIG. 12 but including a diamond film coated passageway;

FIGS. 14, 15, 16, 17, 18 and 19 are schematic views illustrating a patterning technique utilizing a diamond-particle-laden (DPL) carrier including the steps of applying photoresist to an $SiO_2$ surface on a silicon wafer (FIG. 14), patterning the photoresist and subsequently exposing the photoresist, and then applying a diamond-particle-laden (DPL) carrier to the $SiO_2$ surface and the exposed photoresist pattern (FIG. 15), applying a second layer of the photoresist and exposing the photoresist to encode an identical pattern in the second layer of photoresist (FIG. 16), developing the photoresist to remove both layers of the exposed photoresist and the diamond particles entrapped therebetween (thus leaving a remaining pattern of photoresist and diamond particles) (FIG. 17), growing the residue diamond particles trapped under the remaining photoresist pattern into a diamond film by a CVD process which removes the carrier and then grows a diamond film from the residue diamond particles (FIG. 18), and etching the exposed $SiO_2$ material to remove undesirable diamond crystals in the "diamond free" zone (FIG. 19); this technique requiring two masks;

FIGS. 24, 25, 26 and 27 are plan views of masks for a diamond test chip illustrative of integrated circuit-type patterns; and FIG. 28 is a plan view of a composite mask layout utilizing the masks of FIGS. 24–27.

DETAILED DESCRIPTION OF PREFERRED EMBODIMENTS

Figure 1:
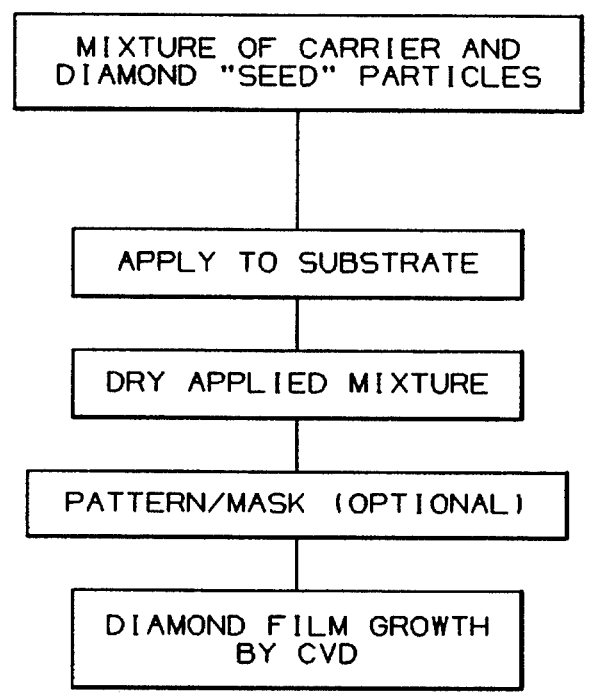
FIG. 1 is a flow diagram of a process embodying the present invention for diamond film growth on a non-diamond substrate.
Figure 2:
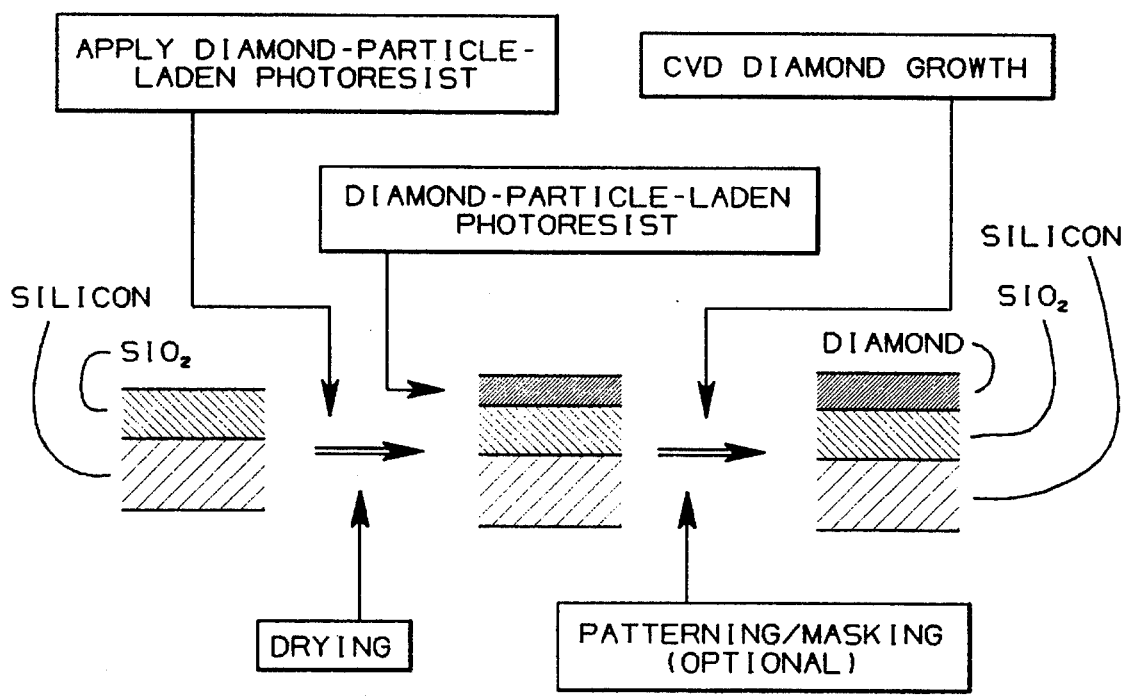
FIG. 2 is a schematic view illustrating a particular process utilizing the method disclosed in FIG. 1, the particular process including use of diamond-particle-laden (DPL) photoresist.

A method embodying the present invention (FIG. 1) includes providing a mixture formulated by suspending diamond particles having a predetermined diameter into a selected carrier. The resulting mixture or diamond-particle-laden (DPL) carrier is then applied to a substrate surface, such as by dipping, spraying on a non-planar surface, spraying in a line or pattern, dispensing in a line or pattern, or jet writing in a line or pattern. The choice of the application method depends upon a number of factors such as the type of substrate, the surface contour of the substrate, the carrier properties, and the ease of adapting the chosen method to mass production. After application to the substrate surface, the DPL mixture is then dried. Where the carrier is completely volatile, such as if it is water, this leaves a uniform dispersion of diamond particles on the substrate surface. Where the carrier cannot be completely evaporated, such as if it is a photoresist, the diamond particles are suspended in the dried photoresist in a uniform dispersion over the substrate surface.

Advantageously, the DPL photoresist can be selectively removed or "patterned", such as by photolithography if desired. Alternatively, a mask can be applied to leave a predetermined exposed pattern of the diamond particles. The substrate surface is then treated by a process commonly known as chemical vapor deposition (CVD) which first heats the substrate surface to typically about 900° C. (which removes the photoresist if present to thus leave a uniformly dispersed layer of diamond particles on the substrate surface, FIG. 3), and then grows a crystalline diamond film from the diamond particles using a gaseous mixture such as $CH_4$ and $H_2$ (FIG. 4). The dashed lines in FIG. 3 represent the sequential growth of the diamond particles into the diamond film in FIG. 4.

Mixtures including two different acceptable DPL carriers are described hereinafter, those being photoresist and water, although it is contemplated that other carriers can be used. The criteria for selection of the carrier are 1) ability to suspend and retain diamond powder particles, 2) removal of the fluid material during diamond deposition, 3) no residue of the carrier if it deteriorates adhesion or diamond film quality, and 4) compatibility with the substrate material. However, it is noted that the choice of the carrier is also affected by the diamond particle size, the particular application technique being carried out, and other factors such as quality and consistency required in the diamond film to be grown.

FORMULATING THE MIXTURES

Various concentrations of diamond particles and specific methods of mixing the diamond particles in carriers are contemplated. Further, the mixing methods will vary depending upon the diamond particle size, the carrier and the application technique. In some forms, the diamond particles can be sufficiently uniformly mixed with the carrier by mechanical mixing, or even purchased premixed. For example, diamond particles having an average particle size of about 25 nanometer can be purchased as a suspension in water. In such case, various concentrations can be made by mixing the premixed diamond-particle-laden (DPL) water with additional water or by removing some of the water in the DPL water to arrive at a desired concentration for application.

Where photoresist is used as the carrier, additional mixing methods other than only mechanical stirring of the photoresist are usually desirable. In one alternative, the diamond particles are admixed with photoresist thinner and then later admixed with photoresist. This interim step allows for a more uniform mixture but with an overall reduced mix time. For example, a type A photoresist thinner from Shipley Company can be used for this purpose. Because of the low viscosity, the diamond powder tends to more quickly form a more homogeneous suspension with the thinner than with the photoresist itself. Still another method to break the clusters/agglomeration of diamond particles in the photoresist is to dry the diamond powder for a period of time, such as at 60° C. for two hours. The dried diamond powder can then be added to the photoresist or to a thinner as previously noted. Notably, two or more of these techniques can be used in combination.

Once uniformly mixed, the diamond-particle-laden (DPL) mixture can be applied to a substrate surface in a number of different ways, as discussed below. The choice of application will depend upon the mixture itself and also the contemplated use of the coated substrate. For example, a cutting tool having a contoured surface would likely be dip-coated if only the leading cutting edge of the tool needs to be coated. Other more sophisticated application techniques include spraying such as to cover all or part of a non-planar surface, spraying in a line or pattern, dispensing in a line or pattern, or jet writing in a line or pattern, as noted below.

An exemplary diamond powder suspension or DPL mixture was created in a photoresist as follows. A weight of 142 milligrains of diamond powder with an average particle size diameter of about 0.1 microns was admixed with 16 milliliters of a photoresist material. The diamond powder had an average particle size of about 0.1 microns and was procured from Amplex, Bloomfield, Conn. under the trade name called "Ultra Virgin Diamond Powder", while the photoresist was obtained from Shipley Company, Inc., Malborough, Md. and is sold under stock number 51813. However, it is contemplated that other diamond powders and carriers are also acceptable. The mixture was mechanically mixed for several minutes and further was ultrasonically agitated with a microsonic agitator for several additional minutes. Soon after mixing the mixture was applied to a silicon wafer to a thickness of several. Thereafter, the applied mixture was dried at 80° C. for 20 minutes.

In one test, the mixture was mechanically stirred in a photoresist thinner by a magnetically operated stirrer for a short period of time, for example about fifteen minutes. This step was then followed by fifteen minutes of ultrasonic agitation. The suspension of diamond powder in the diamond resist thinner was then mixed in the photoresist and further stirred and ultrasonically agitated for fifteen minutes each. This photoresist mixture was then ready for coating/application to a non-diamond substrate.

In a second exemplary mixture, diamond particles having an average particle size of about 25 nanometers suspended in water were used. The material was purchased from DuPont under the trade name MyPolex®. A key advantage of using 25 nanometer size diamond particles is that the diamond particles do not tend to settle out of the mixture, but rather form a semi-stable suspension in the water. Further, the use of smaller sized diamond particles such as 25 nanometer diamond powder allows higher nucleation densities which allow a thinner continuous film to be grown. The reason is because as the film is grown in the CVD process, the diamond particles grow larger and larger in three dimensions until the growing diamond crystals touch each other. This is represented by the multiple dotted lines in FIG. 3. By having a higher nucleation density (i.e. a higher density of small-sized diamond particles), the particles join together to form a continuous film sooner, thus not needing to grow so large (i.e. so thick) in order to join with the next growing crystal. By use of the 25 nanometer diamond particles, nucleation densities of $10^{11}/cm^2$ were possible without problems of particle bunching or agglomerating on the substrate surface. This compares to nucleation densities of about $10^8/cm^2$ in typical diamond seeding processes for CVD (and compares to high end nucleation densities of about $10^{10}/cm^2$ reported in some literature). Thus, use of the 25 nanometer diamond particles advantageously leads to a thinner and more uniform diamond film from the CVD process.

Diamond film thickness and uniformity are particularly important when manufacturing thermal sensors, heaters, and other electrical components, particularly where electrical resistivity and accuracy of measurement is important. Notably, the grain size and the density of the associated grain boundaries have a great influence on the properties of the grown diamond films, and it is thus necessary to control the nucleation density carefully and its uniformity over the substrate surface. For example, the film properties such as carrier mobility and thermal conductivity have been shown to diminish with decreasing grain size, while the homogeneity and surface smoothness is found to be better for small grain size films especially of small thickness. Therefore, by balancing the diamond particle size and density of distribution with application needs, an optional diamond film can be obtained.

Binder material can also be admixed with the DPL carrier to improve adhesion of the diamond film to non-diamond substrates (FIGS. 5 and 6). Alternatively, the binder can be separately mixed with a carrier such as photoresist to form a separate mixture, and then applied in a separate step, preferably before the application of the DPL carrier to the substrate surface. The binder material acts as an adhesive or brazing material between the diamond and the substrate. A typical binder material is Ti, although it is contemplated that other materials could be used as long as they are compatible with CVD processes and do not disrupt the growth of the diamond film. The amount of the increase in adhesion can be controlled by controlling the concentration of the binder and by the selection of the binder to be used.

This new procedure provides a new technique for increasing the adhesion of the diamond film on materials which are known to show poor adhesion to non-diamond surfaces, but without the addition of multiple or separate complicated and difficult to control manufacturing steps. For example, such increased adhesion may be required when coating cutting tools with diamond films in order to prevent premature loss of the diamond film. Also, increased adhesion may be desired when coating a surface to obtain the beneficial properties of diamond film, such as its high thermal conductivity, high chemical resistance, and high radiation resistance. For example, it is contemplated to be desirable to include binder to increase adhesion of diamond films used to cover integrated circuits and sensors to be used in severe environments such as wind tunnels, or other mechanically and chemically active environments.

SPRAYING OF DIAMOND-PARTICLE-LADEN CARRIER

Testing has shown that the diamond-particle-laden (DPL) carrier (i.e. either DPL photoresist or DPL water) can be applied to a three dimensional non-planar surface by spraying, either as a coating completely covering the surface, or as a localized coating applied only in a specific location. Further, the DPL carrier can be spray-applied in a line or in a desired pattern. The process of spraying, hereinafter called wet diamond powder spraying (WDPS), can be employed for coating a number of different objects having different shapes. In the WDPS process, one of the aforementioned mixtures of DPL carrier is applied to the object surface (FIGS. 7 and 8) and then dried. Where DPL photoresist is used, the dried layer thickness is usually in the range of 2 to 200 microns with the nucleation density of diamond particles depending upon the concentration of the diamond particles in the original mixture and also depending upon the thickness of the dried coating. The final step is treatment of CVD which removes the carrier substance on one hand, enhances the binder action (if present) on the other, and further grows a thin diamond film from the diamond particles left on the treated surface. Notably, thicker films of dried DPL carrier result in an increased concentration of diamond particles on tM substrate surface after removal of the photoresist by the CVD process. As previously discussed, this affects the diamond crystal size and the uniformity of the final diamond film thickness. Thus, uniform and accurate control of the applied photoresist film thickness is necessary.

Spray devices are in two major categories: 1) gas nozzle spray devices and 2) ultrasonic atomizing nozzle spray devices. Gas spray nozzle devices tend to be lower in cost, however they rely on pneumatic pressure to break the liquid into droplets and distribute the spray. Disadvantageously, gas nozzle spray devices are prone to over-spray, and the nozzles are apt to wear out quickly and/or clog easily (for devices applying small spray patterns) due to the presence of the hard diamond particles.

In ultrasonic atomizing nozzle spray devices, atomization occurs as liquid comes in contact with the vibrating nozzle atomizing surface. Spraying by ultrasonic nozzle spray devices has proven particularly satisfactory in spraying DPL carriers due to the "soft" spray pattern generated which has a low velocity and decreased tendency to exhibit "bounce back". Drops are formed when the ultrasonic energy exceeds the liquid surface tension. Drop distribution is determined by nozzle frequency and the ultrasonic energy of the nozzle, liquid surface tension, and liquid viscosity, with frequency being the key factor in defining the range of drop diameters for a given size nozzle. The higher the frequency the smaller the drop size. Pressure does play a role in the atomization but there is no need for gas pressure. Spray velocities are in the range of 0.7 to 1.2 feet per second compared to 35 to 70 feet per second for pressure nozzles. Ultrasonic atomizing nozzle spray devices advantageously create a soft low velocity spray that minimizes over-spray. Still further, wide flow rates are possible including operation in the range of micro liters per minute. Thus, fine lines can be sprayed by use of an ultrasonic atomizing nozzle spray device.

An exemplary ultrasonic atomizing nozzle made by Sonotek Ultrasonic Company is shown in FIG. 9. The illustrated nozzle 20 is included herein only by way of example, and no claim to its specific configuration is made. Nozzle 20 includes a central bolt 21 defining a front horn 22 and a feed tube 23 extending through central bolt 21 to front horn 22. A rear horn 24 is positioned on central bolt 21, and piezoelectric transducers 25 and 26 are positioned between front horn 22 and rear horn 24 on central bolt 21. Actuation of transducers 25 and 26 cause front horn 22 to dispense atomized fluid particles, such as the diamond-particle-laden photoresist mixtures previously described. Notably, it is contemplated that feed tube 23 can be coated with a diamond film for increased wear resistance and to prevent degradation by the hard diamond particles in the photoresist. Use of the nozzle 20 allows DPL carrier to be applied to completely cover an area, or to be selectively applied to cover only a selected area.

DISPENSING LINES OF DIAMOND-PARTICLE-LADEN CARRIER

In addition to coating large surface areas or surface area sections by use of WDPS, additional novel application methods and apparatus are contemplated. For example, initially it is noted that WDPS can be used to apply DPL carrier in lines or patterns. This is illustrated in FIG. 10, wherein spray nozzle 20 is positioned above a substrate surface 28 a short distance. Spray nozzle 20 is operably connected to a positioning device 30 for controlling the relative position of spray nozzle 20 to substrate surface 28. A supply of DPL carrier 31 is operably connected to spray nozzle 20, and a fluid motivator device 32 is connected to motivate DPL carrier through passageway 23 in spray nozzle 20 out of an opening 42 in nozzle tip 44 onto substrate surface 28. Notably, the width D2 of the pattern 36 varies considerably depending on the size D1 of nozzle opening 42 and the distance between nozzle tip 44 and substrate surface 28. A controller 34 can be operably connected to fluid motivator 32 and positioning device 30 to control spray nozzle 20 for creating a preprogrammed pattern on substrate surface 28.

Another novel applicator is an ink jet-type applicator 60 (FIG. 11), which is configured much like some ink .jet printers. Ink jet-type applicator 60 utilizes a piezoelectric mechanism 62 to "jet write" DPL carrier in the form of droplets 64 onto a substrate surface. Jet write mechanisms are generally known in industry and hence a detailed description is not believed to be necessary in this application.

Yet another innovative applicator 70 (FIG. 12) and method has been developed for applying DPL carrier. When investigating this concept, an experimental applicator having a passageway diameter of 25 microns was tested. The line dispensed by use of the 25 micron nozzle was about three times larger than the passageway, i.e. about 75 microns in width. Based on the material properties of DPL carriers filled with 0.1 micron sized diamond particles, a 10 micron sized passageway nozzle thus can be safely used to dispense a 30 micron width line of diamond film without fear of plugging the passageway. Further, a 1 micron sized passageway nozzle can be used to dispense a 3 micron wide line of DPL carrier filled with 25 nanometer average size diamond particles. It is further contemplated that submicron width lines could also be drawn by use of the innovative applicator and method disclosed herein.

An exemplary applicator 70 for dispensing a line (FIG. 12) embodying the present invention includes a nozzle 71 with a passageway 72 and a tip opening 73 connected to passageway 72. A supply of DPL carrier 74 is connected to passageway 72 by supply line 75, and a fluid motivator 76 is operably connected to supply 74 and to a controller 77. A positioning device or robot 78 is further connected to nozzle 71 and to controller 77. By controlling the flow of DPL carrier and the position of nozzle 71, a well defined pattern/line 79 of DPL carrier can be applied to substrate surface 80. Thus, the step of patterning and/or masking can be eliminated. For example, this technique is useful for drawing serpentine lines or short lines such as for diamond film heaters, thermocouples, sensors, micromechanical devices, and integrated circuits.

The illustrated nozzle 71 of applicator 70 is shown as not being in contact with the substrate surface 80, and further substrate surface 80 is shown as being planar. However, it is contemplated that the applicator 80 can apply lines to a non-planar 3D surface, such as by angling the nozzle 71 and sliding nozzle 71 across the substrate surface 80, much like a pencil or pen on paper. Further, the passageway 72 of dispenser/applicator nozzle 71 (FIG. 13) can be coated by a diamond film 82 for increased wear resistance against the abrasive diamond particles in the DPL carrier. The diamond film 82 can be applied such as by a CVD process.

PATTERNING TECHNIQUES UTILIZING DPL CARRIERS

Advantageously, the diamond-particle-laden (DPL) carriers allow new patterning methods to be employed. It is noted that the two methods disclosed in FIGS. 14–19 and FIGS. 20–23 utilize photoresist which is removable after being exposed by a developer (i.e. positive photoresist), although comparable methods are possible by use of photoresist which is removable by developer except after being exposed (i.e. negative photoresist).

In the method shown in FIGS. 14–19, a silicon wafer 110 is provided with an oxidized layer of silicon (SiO$_2$) 112 (FIG. 14). A layer of photoresist 114 is applied to the silicon dioxide layer 112 by any of the methods previously described. Photoresist 114 is initially patterned and then exposed in a photolithographic process, as known in the art, to form exposed photoresist pattern sections 114A and 114B (FIG. 15). A layer 118 of DPL carrier is then applied on exposed photoresist pattern 114A and 114B and on silicon dioxide layer 112. Another layer of photoresist 120 is applied on top of DPL carrier layer 118 (FIG. 16). Layer 120 is exposed in a photolithographic process in a pattern identical to that of 114A and 114B, thus creating exposed sections 120A and 120B and leaving unexposed sections 120C and 120D. The exposed photoresist sections 120A and 120B and 114A and 114B are then removed by the developer (not shown) (FIG. 17). Notably, the photoresist sections 114A and 114B located under DPL carrier 118 (FIG. 16) assist in removing all of the diamond particles in DPL carrier layer 118 in the open areas 119 (FIG. 17). This leaves a pattern of photoresist sections 120C and 120D and DPL carrier 118 on silicon dioxide layer 112. Wafer 110 is then treated by a chemical vapor deposition (CVD) process wherein the photoresist sections 120C and 120D are removed and the residue diamond particles are grown into a continuous polycrystalline diamond layer in the shape of the pattern (FIG. 18). As a supplemental process, it may be desirable to etch the open areas 119 on the silicon dioxide layer 112 not covered by the continuous diamond film 122 in order to remove any undesirable diamond crystals that undesirably grow in the open areas (FIG. 19).

Figure 20:
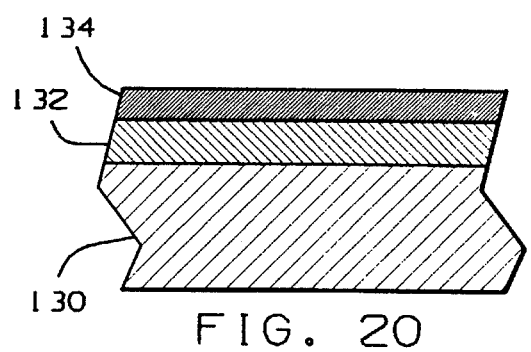
FIGS. 20, 21, 22 and 23 are schematic views illustrating a second patterning technique utilizing a diamond-particle-laden (DPL) carrier including the steps of applying photoresist to an $SiO_2$ surface of a silicon wafer (FIG. 20), exposing the photoresist and then applying a layer of diamond-particle-laden (DPL) carrier and a pattern of photoresist on the DPL carrier (FIG. 21), removing the exposed photoresist not covered by unexposed photoresist to leave a remaining pattern of diamond particles and photoresist (FIG. 22), and growing the diamond particles into a diamond film by a CVD process (FIG. 23); this technique requiring only one mask.
Figure 22:
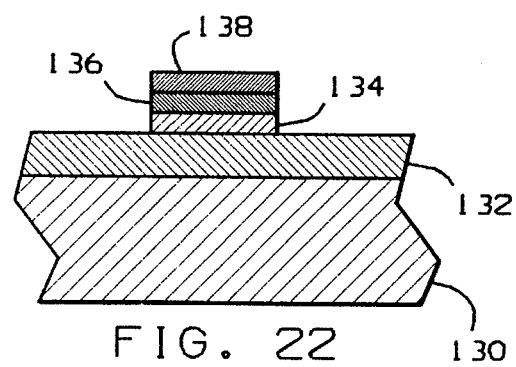
Figure 21:
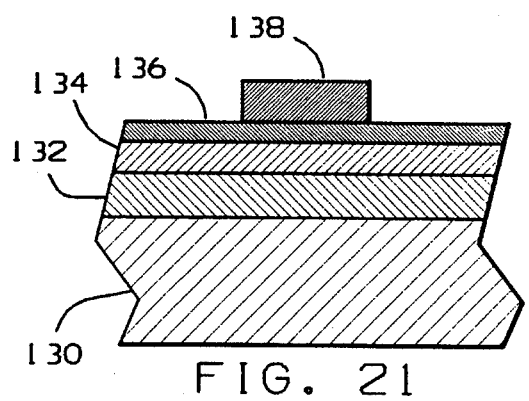
Figure 23:
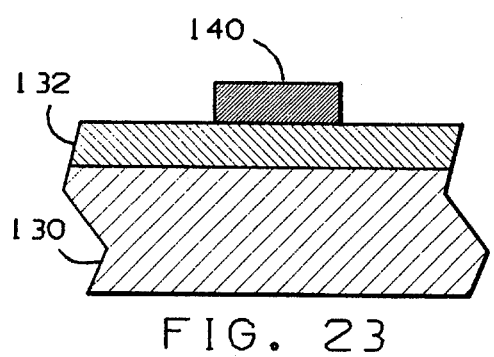

In a second method or patterning technique (FIGS. 20–23), which uses only one mask, a silicon wafer 130 having an oxidized (SiO2) surface 132 is coated with a photoresist material 134 (FIG. 20). The entire photoresist material 134 is exposed so that it can be later removed by the developer fluid. A layer of DPL carrier 136 is applied on exposed photoresist layer 134 (FIG. 21), and a patterned layer of photoresist 138 is applied onto DPL carrier layer 136. The developer fluid is then applied to remove those areas of the exposed photoresist 134 not covered by the pattern of photoresist layer 138 (FIG. 22). As portions of exposed photoresist 134 are removed, the DPL carrier 136 is also removed, thus leaving a laminated pattern of photoresist 138, DPL carrier 136, and exposed photoresist 134 (protected by the photoresist 138) (FIG. 22). Silicon wafer 130 is then treated by a CVD process (FIG. 23), which evaporates the photoresist layers 138 and 132, and grows a polycrystalline diamond film pattern/layer 140 from the diamond particles within the DPL carrier 136.

DIAMOND FILM PATTERNS INTEGRATED INTO INTEGRATED CIRCUITS

By use of the aforementioned techniques and apparatus, integrated circuits can be manufactured wholly or in part by patterned diamond films, or can be protected by the diamond films. In particular, electrical branches having high heat transfer capabilities are possible. By way of example, an exemplary integrated circuit made by a four mask fabrication process is shown, FIGS. 24–27 showing the masks, and FIG. 28 showing the final composite product. Notably, the contacts on the temperature sensor are metal to facilitate connecting thereto. Further, exemplary structures potentially made by one or more of the above noted methods are disclosed in a copending U.S. patent application Ser. No. 08/178,784, entitled DIAMOND FILM STRUCTURES AND METHODS RELATED TO SAME, filed Jan. 7, 1994, (filed simultaneously with this application) by inventor Mohammad Aslam.

It is contemplated that whole regions or branches of an integrated circuit could be made from laminated diamond film layers, either doped and/or undoped. For example, this would allow integrated circuits to be used in chemically or mechanically harsh environments, even where the substrate cannot withstand such harsh environments. The diamond nucleation techniques disclosed in this invention are appropriate for coating of existing integrated circuits with a film of CVD diamond to protect the existing circuits from the harsh environment. For example, the method would include applying a layer of DPL carrier to the surface of the existing integrated circuit. A protective diamond film would then be deposited by CVD at a temperature that is compatible with the substrate material of the existing integrated circuit.

In the foregoing description, it will be readily appreciated by those skilled in the art that modifications may be made to the invention without departing from the concepts disclosed herein. Such modifications are to be considered as included in the following claims, unless these claims by their language expressly state otherwise.

The embodiments of the invention in which an exclusive property or privilege is claimed are defined as follows:

1. A method of seeding for diamond film growth on a non-diamond substrate having a surface, comprising:

providing a mixture including a photoresist, binder particles and an amount of diamond particles uniformly distributed in said photoresist; and applying said mixture in a line onto said non-diamond substrate surface, said line having a width not exceeding a width of about 7.5 microns.

2. A method as defined in claim 1 including selecting diamond particles having an average particle diameter of not greater than about 0.1 microns.

3. A method as defined in claim 2 including selecting diamond particles having an average particle diameter of not greater than about 25 nanometers.

4. A method as defined in claim 1 including growing a diamond film from said diamond particles by a chemical vapor deposition process.

5. A method as defined in claim 1 wherein the step of providing binder particles includes providing a powder of Ti.

6. A method as defined in claim 1 including providing a second photoresist, mixing said binder particles with said second photoresist to form a second mixture, and applying said second mixture to said substrate surface.

7. A method as defined in claim 1 including a step of selectively removing said photoresist by photolithography to leave a pattern of said diamond particles on said substrate surface.

8. A method as defined in claim 1 including providing an ultrasonic nozzle spray device, and wherein the step of applying said mixture includes spraying said mixture with said ultrasonic nozzle spray device.

9. A method as defined in claim 1 wherein the step of applying said mixture includes dispensing said mixture in a pattern having a particular configuration for use in a micro circuit.

10. A method as defined in claim 9 wherein the step of dispensing includes providing an applicator and utilizing said applicator to apply a non-linear line of said mixture onto said substrate surface.

11. A method as defined in claim 9 wherein said step of applying includes forming a line having a width of not greater than about 30 microns.

12. A method as defined in claim 9 wherein said pattern includes a serpentine line.

13. A method of seeding for diamond film growth, comprising:

providing a photoresist;

providing a supply of diamond particles;

providing a supply of binder particles for promoting adhesion of diamond film to a substrate surface;

ultrasonically mixing said diamond particles and said binder particles with said photoresist to form a uniform mixture; and applying said mixture to said substrate surface.

14. A method as defined in claim 13 including selectively removing said photoresist to leave a pattern.

15. A method as defined in claim 13 wherein said binder particles include Ti.

16. A method as defined in claim 13 wherein said binder particles have an average particle size in the range of not greater than about 0.1 micron.

17. A method comprising:

providing a mixture of diamond particles, binder particles and a photoresist;

providing an applicator configured to apply said mixture in a line; and applying said mixture in a line to a substrate surface by use of said applicator, said line having a width not exceeding about 75 microns.

18. A method as defined in claim 17 wherein said step of applying includes dispensing said mixture in a line having a width of not greater than about 30 microns.

19. A method as defined in claim 18 including dispensing said mixture in a fine line having a width of not greater than about 3 microns.

20. A method as defined in claim 17 including drawing a pattern with said applicator and growing a diamond film in shape of said pattern by use of a chemical vapor deposition process.

21. A method as defined in claim 20 including applying said mixture in a second pattern by use of the applicator, said first and second patterns partially overlapping.

22. A method as defined in claim 17 wherein the step of applying includes spraying said material from said applicator onto said substrate surface.

23. A method as defined in claim 17 wherein said step of applying includes flowing said mixture in a stream from said applicator onto said substrate surface.

24. A method as defined in claim 17 including providing a positioning device attached to said applicator, and including controllingly moving said applicator by said positioning device to draw a pattern onto said substrate surface.

25. A method as defined in claim 24 wherein the step of applying includes applying said mixture in a serpentine pattern.

26. A method as defined in claim 17 including providing a positioning device and a controller operably connected to said positioning device for controlling said positioning device, and including the step of programming said controller to control the position of said applicator during the step of applying.

27. A method of seeding for diamond film growth on a non-diamond substrate having a surface, comprising steps of:

mixing diamond particles, binder particles and photoresist to form a uniform mixture; and spraying the mixture of diamond particles, binder particles and photoresist onto the surface of the non-diamond substrate.

28. A method as defined in claim 27 wherein the step of spraying includes manipulating a spray nozzle to coat a non-planar, three-dimensional portion of the surface.

29. A method as defined in claim 28 wherein the step of spraying includes dispensing the mixture using an ultrasonic spray nozzle.

30. A method as defined in claim 29 including a step of selectively removing portions of the photoresist including any diamond particles in the selectively removed portions of the photoresist to form a pattern on the surface.

31. A method as defined in claim 30 including a step of growing the diamond particles into a doped diamond film bonded to the three-dimensional portion of the surface by the binder particles, the doped diamond film forming part of an electrically conductive device located on the surface.

32. A method comprising steps of:

providing a mixture of photoresist, diamond particles having particle size of less than about 25 nanometers and binder particles;

ultrasonically agitating the mixture to assure uniformity;

providing an applicator and a position controlling device including a controller for controlling the movement of the applicator;

applying the mixture to a non-planar, three-dimensional surface of a non-diamond substrate in a line having a width of about 30 microns or less with the applicator;

patterning the photoresist to leave a pattern of the mixture on the surface; and growing the diamond particles into a doped diamond film bonded to the three-dimensional surface of the non-diamond substrate by the binder particles, the diamond film forming part of an electrical device located on the surface.

33. A method of seeding for diamond film growth on a non-diamond substrate having a surface, comprising steps of:

mixing diamond particles, binder particles and photoresist to form a uniform mixture; and dipping the non-diamond substrate into the mixture to coat the surface of the non-diamond substrate.

* * * * *

UNITED STATES PATENT AND TRADEMARK OFFICE
CERTIFICATE OF CORRECTION

PATENT NO.   : 5,474,808
DATED        : December 12, 1995
INVENTOR     : Mohammad Aslam It is certified that error appears in the above-identified patent and that said Letters Patent is hereby corrected as shown below:

Column 1, line 37;
    "fifth" should be --thin--.

Column 5, line 24;
    "milligrains" should be --milligrams--.

Column 7, line 15;
    "tM" should be --the--.

Column 9, line 52;
    "(SiO2)" should be --($SiO_2$)--.

Column 10, line 52;
    "7.5" should be --75--.

Signed and Sealed this

Second Day of July, 1996

Attest:

BRUCE LEHMAN

Attesting Officer

Commissioner of Patents and Trademarks